(12) United States Patent
Kim et al.

(10) Patent No.: US 9,465,400 B2
(45) Date of Patent: Oct. 11, 2016

(54) APPARATUS AND METHOD FOR COMPENSATING OUTPUT SIGNAL

(71) Applicant: Hyundai Autron Co., Ltd., Seongnam-si (KR)

(72) Inventors: Jung Yong Kim, Seoul (KR); Chul Seung Lee, Seoul (KR)

(73) Assignee: Hyundai Autron Co., Ltd., Seongnam-si (KR)

( * ) Notice: Subject to any disclaimer, the term of this patent is extended or adjusted under 35 U.S.C. 154(b) by 0 days.

(21) Appl. No.: 14/966,393

(22) Filed: Dec. 11, 2015

(65) Prior Publication Data

US 2016/0170434 A1    Jun. 16, 2016

(30) Foreign Application Priority Data

Dec. 12, 2014  (KR) .......................... 10-2014-0178997

(51) Int. Cl.
*H03M 1/00*     (2006.01)
*G05F 5/00*     (2006.01)

(52) U.S. Cl.
CPC ................ *G05F 5/00* (2013.01); *H03M 1/001* (2013.01)

(58) Field of Classification Search
CPC .............................. G05F 3/205; H03M 1/001
USPC .......................... 341/110, 119, 126, 144, 155
See application file for complete search history.

(56) References Cited

U.S. PATENT DOCUMENTS

| 8,051,711 | B2 * | 11/2011 | Grosjean ................ | G01C 19/00 |
| | | | | 73/489 |
| 8,736,469 | B2 * | 5/2014 | Fabregas ................. | H02M 7/02 |
| | | | | 341/119 |
| 2010/0060358 | A1 | 3/2010 | Nentwig | |

FOREIGN PATENT DOCUMENTS

| JP | 8-503118 A | 4/1996 |
| JP | 2001-308705 A | 11/2001 |
| JP | 2007-502577 A | 2/2007 |
| JP | 2014-175925 A | 9/2014 |
| KR | 2000-0034175 A | 6/2000 |
| KR | 10-2004-0001734 A | 1/2004 |
| KR | 10-2005-0035192 A | 4/2005 |
| KR | 10-0860474 B1 | 9/2008 |
| KR | 10-1077721 B1 | 10/2011 |

* cited by examiner

*Primary Examiner* — Khai M Nguyen
(74) *Attorney, Agent, or Firm* — Morgan, Lewis & Bockius LLP

(57) ABSTRACT

An apparatus for compensating for an output signal may include: a regulator configured to convert power supplied from a power supply unit into a preset voltage; an input unit configured to be supplied with a voltage from the regulator and receive an external input signal; a control unit configured to be supplied with the voltage from the regulator, and transmit the input signal after preset signal processing; and an output unit configured to be supplied with power from the power supply unit and output the received input signal. The input unit may receive a supply voltage of the power supply unit and transmits the received supply voltage to the control unit, and the control unit may compensate for the input signal based on a preset reference supply voltage of the power supply unit and the received supply voltage.

8 Claims, 2 Drawing Sheets

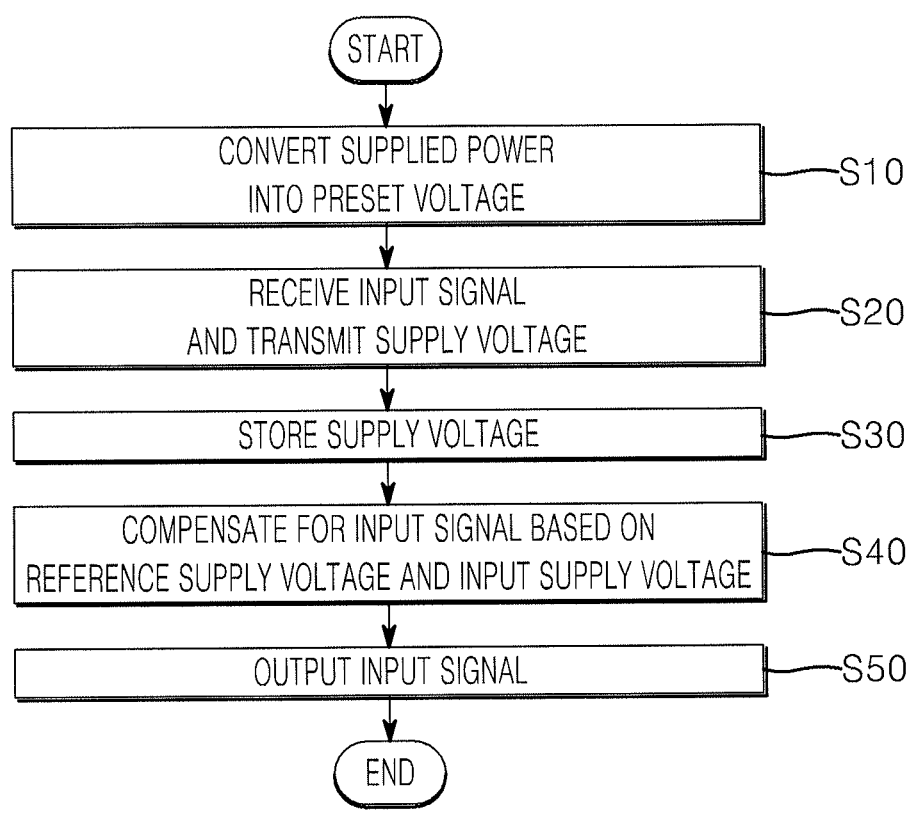

APPARATUS AND METHOD FOR COMPENSATING OUTPUT SIGNAL

CROSS-REFERENCES TO RELATED APPLICATIONS

The present application claims priority to Korean application number 10-2014-0178997, filed on Dec. 12, 2014, which is incorporated by reference in its entirety.

BACKGROUND OF THE INVENTION

The present invention relates to an apparatus and method for compensating for an output signal, and more particularly, to an apparatus and method for compensating for an output signal, which is capable of maintaining an output signal at a stable value regardless of a supply voltage supplied to an output unit such as a DAC (Digital to Analog Converter).

In general, a semiconductor for sensor receives an external analog signal and converts the received analog signal into a digital signal using an ADC (Analog to Digital Converter). Then, the digital signal is processed through digital signal processing, and the semiconductor for sensor reconverts the digital signal into the analog signal through a DAC.

At this time, the ADC and a digital logic part which performs digital signal processing do not directly receive power from a power supply unit, but receive a preset operating voltage from a regulator. Then, the ADC and the digital logic part perform their roles based on the stable operating voltage.

On the other hand, the DAC directly receives power from the power supply unit, and performs a preset role using the received power.

The related art of the present invention is disclosed in Korean Patent Laid-open Publication No. 2000-0034175 published on Jun. 15, 2000 and entitled "Apparatus for compensating for output signal".

The DAC of the conventional semiconductor for sensor converts a digital code processed through digital signal processing and outputs an analog signal. The output signal is designed to be proportional to the voltage of supplied power.

Thus, when power supplied to the DAC fluctuates, the output signal of the DAC also fluctuates.

For example, when the supplied power is reduced by 5% in comparison to power supplied in a normal situation, the output of the DAC is also reduced by 5%. Such a malfunction may cause a distorted signal output, instead of a normal signal output. Thus, when an ECU receives the output signal, the ECU may make a wrong decision.

Furthermore, when the ECU makes a wrong decision, an actuator which operates according to a command of the ECU may cause a malfunction. In the case of a semiconductor for sensor which is used for a vehicle, a system malfunction may significantly threaten a driver's safety.

BRIEF SUMMARY

Embodiments of the present invention are directed to an apparatus and method for compensating for an output signal, which is capable of maintaining an output signal at a stable value regardless of a supply voltage supplied to an output unit such as a DAC.

In one embodiment, an apparatus for compensating for an output signal may include: a regulator configured to convert power supplied from a power supply unit into a preset voltage; an input unit configured to be supplied with a voltage from the regulator and receive an external input signal; a control unit configured to be supplied with the voltage from the regulator, and transmit the input signal after preset signal processing; and an output unit configured to be supplied with power from the power supply unit and output the received input signal. The input unit may receive a supply voltage of the power supply unit and transmits the received supply voltage to the control unit, and the control unit may compensate for the input signal based on a preset reference supply voltage of the power supply unit and the received supply voltage.

The apparatus may further include a memory unit configured to receive the supply voltage of the power supply unit from the input unit and store the received supply voltage.

The input unit may include an ADC to convert a received analog signal into a digital signal, and the output unit may include a DAC to convert the digital signal into an analog signal.

The control unit may compensate for the input signal such that the input signal is inversely proportional to the magnitude of the received supply voltage with respect to the reference supply voltage.

The control unit may correct the input signal into a value obtained by multiplying a reciprocal of the received supply voltage with respect to the reference supply voltage by the input signal.

In another embodiment, a method for compensating for an output signal may include: converting, by a regulator, power supplied from a power supply unit into a preset voltage; receiving, by an input unit, a voltage from the regulator and receiving an external input signal; receiving, by a control unit, the voltage from the regulator and transmitting the input signal after preset signal processing; and receiving, by an output unit, power from the power supply unit and outputting the received input signal. In the receiving of the external input signal, the input unit may receive a supply voltage of the power supply unit and transmits the received supply voltage to the control unit, and in the transmitting of the input signal, the control unit may compensate for the input signal based on a preset reference supply voltage of the power supply unit and the received supply voltage.

The method may further include storing, by the input unit, the supply voltage of the power supply unit in a memory unit.

In the receiving of the external input signal, the input unit may include an ADC to convert a received analog signal into a digital signal, and the output unit may include a DAC to convert the digital signal into an analog signal.

In the transmitting of the input signal, the control unit may compensate for the input signal such that the input signal is inversely proportional to the magnitude of the received supply voltage with respect to the reference supply voltage.

The control unit may correct the input signal into a value obtained by multiplying a reciprocal of the received supply voltage with respect to the reference supply voltage by the input signal.

BRIEF DESCRIPTION OF THE DRAWINGS

FIG. 2 is a flowchart illustrating a method for compensating for an output signal in accordance with an embodiment of the present invention.

DETAILED DESCRIPTION

Figure 1:
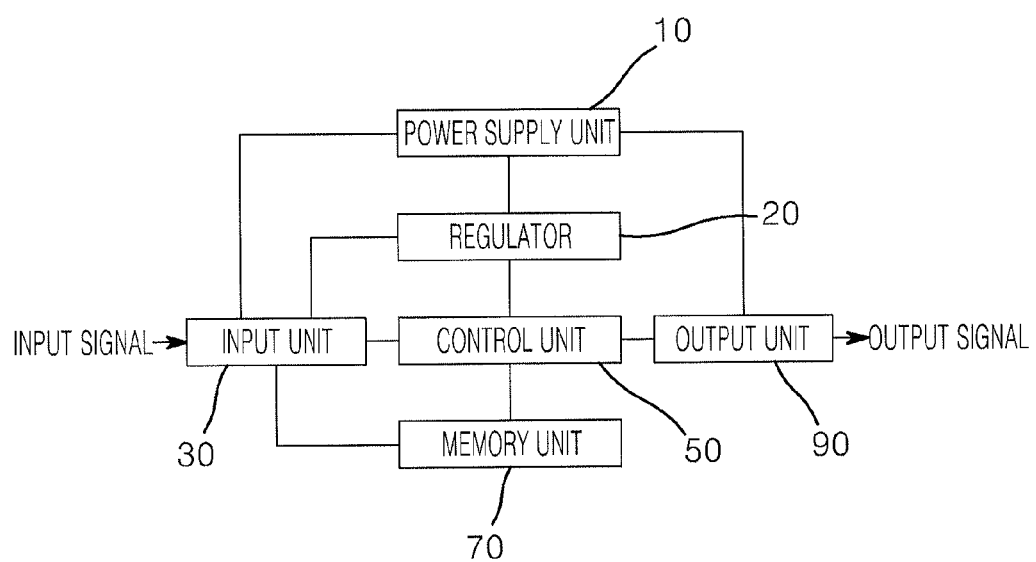
FIG. 1 is a block diagram of an apparatus for compensating for an output signal in accordance with an embodiment of the present invention.

Embodiments of the invention will hereinafter be described in detail with reference to the accompanying drawings. It should be noted that the drawings are not to precise scale and may be exaggerated in thickness of lines or sizes of components for descriptive convenience and clarity only. Furthermore, the terms as used herein are defined by taking functions of the invention into account and can be changed according to the custom or intention of users or operators. Therefore, definition of the terms should be made according to the overall disclosures set forth herein.

FIG. 1 is a block diagram of an apparatus for compensating for an output signal in accordance with an embodiment of the present invention.

Referring to FIG. 1, the apparatus for compensating for an output signal may include a regulator 20, an input unit 30, a control unit 50, a memory unit 70, and an output unit 90.

The regulator 20 may convert power supplied from a power supply unit 10 to a preset voltage.

That is, the regulator 20 may convert the power supplied from the power supply unit 10 into voltages required for the operations of various components connected to the regulator 20.

Thus, the preset voltage may be set to a voltage required for the operation of a component connected to the regulator 20. According to the voltages required for the operations of the respective components, the preset voltage may be set to various values.

The input unit 30 may be supplied with the voltage from the regulator 20, and receive an external input signal.

That is, as described above, the input unit 30 may receive the voltage converted through the regulator 20 and required for the operation of the input unit 30, and receive a preset input signal based on the received voltage.

In particular, the apparatus for compensating for an output signal in accordance with the embodiment of the present invention may include a semiconductor for sensor. At this time, the input unit 30 may include an ADC for receiving an external analog signal.

The input unit 30 may receive an analog signal through the ADC, convert the received signal into a digital signal, and transmit the digital signal to the control unit 50.

In addition, the input unit 30 may not only receive a voltage from the regulator 20, but also receive a supply voltage of the power supply unit 10 which directly supplies a voltage to the output unit 90, and store the received voltage in the memory unit 70.

That is, in order to solve the problem that an output signal of the output unit 90 is distorted as a variation occurs in the supply voltage of the power supply unit 10, the input unit 30 may receive an actual supply voltage of the power supply unit 10, and store the received voltage in the memory unit 70.

The control unit 50 may be supplied with a voltage from the regulator 20 and transmit a signal inputted from the input unit 30 after preset signal processing.

That is, as described above, the control unit 50 may receive the voltage converted through the regulator 20 and required for the operation of the control unit 50, and transmit a preset input signal based on the received voltage.

In the present embodiment, the control unit 50 may compensate for an input signal and transmit the signal to the output unit 90, based on an actual supply voltage inputted from the input unit 30 and a reference supply voltage of the power supply unit 10, which is previously stored in the memory unit 70.

At this time, the reference supply voltage may indicate a voltage which is determined according to the design requirement of the power supply unit 10 and needs to be outputted in a normal state. The reference supply voltage may have various values according to the characteristics of the component having the power supply unit 10 mounted therein.

That is, the control unit 50 may compensate for an input signal based on how much the supply voltage of the power supply unit 10, inputted from the input unit 30, is varied in comparison to the reference supply voltage of the power supply unit 10 which is stored in the memory unit 70. Thus, the control unit 50 may maintain an output signal of the output unit 90 at a normal value, regardless of the variation of the supply voltage.

Specifically, the control unit 50 may compensate for an input signal such that the input signal is inversely proportional to the magnitude of the input supply voltage with respect to the reference supply voltage.

The apparatus for outputting an output signal in accordance with the embodiment of the present invention may be designed in such a manner that, when an input signal transmitted from the control unit 50 is outputted through signal processing of the output unit 90, the output signal of the output unit 90 is proportional to the supply voltage of the power supply unit 10.

Thus, when the magnitude of the input supply voltage is varied with respect to the reference supply voltage, the control unit 50 may previously distort an input signal and transmit the distorted signal to the output unit 90. Then, the output unit 90 can output a normal signal at all times.

Specifically, when the input supply voltage becomes larger than the reference supply voltage, the control unit 50 may compensate for an input signal to be transmitted to the output unit 90 such that the signal has a smaller value. When the input supply voltage becomes smaller than the reference supply voltage, the control unit 50 may compensate for an input signal to be transmitted to the output unit 90 such that the signal has a larger value.

More specifically, the control unit 50 may compensate for an input signal using a value obtained by multiplying the input signal by a reciprocal of the input supply voltage with respect to the reference supply voltage.

For example, when the supply voltage of the power supply unit 10, which is actually received by the input unit 30, is varied to 9V in a state where the reference supply voltage is 10V, the output signal of the output unit 90 may be distorted due to a lack of the supply voltage. Thus, the control unit 50 may correct an input signal into a value obtained by multiplying the input signal by a reciprocal of the input supply voltage with respect to the reference supply voltage (10/9), and transmit the signal to the output unit 90, thereby preventing the distortion of the output signal of the output unit 90.

The memory unit 70 may receive the supply voltage of the power supply unit 10 from the input unit 30, and store the preset reference supply voltage of the power supply unit 10.

Thus, the control unit 50 may compare the reference supply voltage during a normal operation of the power supply unit 10 to an actual supply voltage of the power supply unit 10, which is supplied to the input unit 30. Then, when a variation occurs in the supply voltage of the power supply unit 10, the control unit 50 may compensate for an input signal.

The output unit 90 may be supplied with a voltage from the power supply unit 10, and output an input signal to be transmitted from the control unit 50.

That is, the output unit 90 may directly receive a voltage from the power supply unit 10, and output a preset input signal based on the received voltage.

In particular, the apparatus for outputting an output signal in accordance with the embodiment of the present invention may include a semiconductor for sensor. At this time, the output unit 90 may include a DAC for receiving a digital signal from the input unit 30.

The output unit 90 may receive a digital signal through the DAC, and convert the received digital signal into an analog signal.

As described above, the control unit 50 may compare a supply voltage supplied to the output unit 90 to the reference supply voltage of the power supply unit 10, previously compensate for an input signal, and transmit the signal. Thus, the output unit 90 may always output a normal signal regardless of a variation of the supply voltage.

FIG. 2 is a flowchart illustrating a method for compensating for an output signal in accordance with an embodiment of the present invention.

Referring to FIG. 2, the method for compensating for an output signal in accordance with the embodiment of the present invention will be described as follows. First, the regulator 20 may convert power supplied from the power supply unit 10 into a preset voltage at step S10.

That is, the regulator 20 may convert the power supplied from the power supply unit 10 into voltages required for operations of various components connected to the regulator 20.

The input unit 30 may receive an external input signal, based on the voltage from the regulator 20, at step S20.

That is, as described above, the input unit 30 may receive the voltage converted through the regulator 20 and required for the operation of the input unit 30, and receive a preset input signal based on the received voltage.

In addition, the input unit 30 may not only receive a voltage from the regulator 20, but also receive a supply voltage of the power supply unit 10 which supplies a voltage to the output unit 90, and transmit the received voltages together.

Then, the memory unit 70 may receive the supply voltage of the power supply unit 10, which is transmitted from the input unit 30, and store the received supply voltage, at step S30.

That is, the memory unit 70 may not only store the preset reference supply voltage of the power supply unit 10, but also receive the supply voltage of the power supply unit 10 from the input unit 30 and store the received voltage. Thus, the control unit 50 may sense a variation of the actual supply voltage of the power supply unit 10 with respect to the reference supply voltage.

The control unit 50 may receive a voltage from the regulator 20 and transmit an input signal. In particular, the control unit 50 may compensate for the input signal based on the reference supply voltage stored in the memory unit 70 and the actual supply voltage of the power supply unit 10, and transmit the signal to the output unit 90, at step S40.

That is, the control unit 50 may compensate for the input signal based on how much the supply voltage of the power supply unit 10, inputted from the input unit 30, is varied in comparison to the reference supply voltage of the power supply unit 10 which is stored in the memory unit 70. Thus, the control unit 50 may maintain an output signal of the output unit 90 at a normal value regardless of the variation of the supply voltage.

Specifically, the control unit 50 may compensate for the input signal such that the input signal is inversely proportional to the magnitude of the input supply voltage with respect to the reference supply voltage.

That is, when the input supply voltage becomes larger than the reference supply voltage, the control unit 50 may compensate for the input signal to be transmitted to the output unit 90 such that the signal has a smaller value. When the input supply voltage becomes smaller than the reference supply voltage, the control unit 50 may compensate for the input signal to be transmitted to the output unit 90 such that the signal has a larger value.

More specifically, the control unit 50 may correct an input signal into a value obtained by multiplying the input signal by a reciprocal of the input supply voltage with respect to the reference supply voltage.

Then, the output unit 90 may output the input signal transmitted from the control unit 50, based on the voltage supplied from the power supply unit 10, at step S50.

In accordance with the present embodiment, the apparatus and method for compensating an output signal can maintain an output signal at a stable value regardless of a variation of the supply voltage.

Furthermore, the apparatus and method can be simply implemented only by adding control logic without changing the hardware of the semiconductor for sensor.

Although preferred embodiments of the invention have been disclosed for illustrative purposes, those skilled in the art will appreciate that various modifications, additions and substitutions are possible, without departing from the scope and spirit of the invention as defined in the accompanying claims.

What is claimed is:

1. An apparatus for compensating for an output signal, comprising:
    a regulator configured to convert power supplied from a power supply unit into a preset voltage;
    an input unit configured to be supplied with a voltage from the regulator and receive an external input signal;
    a control unit configured to be supplied with the voltage from the regulator, and transmit the input signal after preset signal processing; and
    an output unit configured to be supplied with power from the power supply unit and output the received input signal,
    wherein the input unit receives a supply voltage of the power supply unit and transmits the received supply voltage to the control unit, and the control unit compensates for the input signal based on a preset reference supply voltage of the power supply unit and the received supply voltage, and
    wherein the control unit compensates for the input signal such that the input signal is inversely proportional to the magnitude of the received supply voltage with respect to the reference supply voltage.

2. The apparatus of claim 1, further comprising a memory unit configured to receive the supply voltage of the power supply unit from the input unit and store the received supply voltage.

3. The apparatus of claim 1, wherein the input unit comprises an ADC (Analog to Digital Converter) to convert a received analog signal into a digital signal, and the output unit comprises a DAC (Digital to Analog Converter) to convert the digital signal into an analog signal.

4. The apparatus of claim 1, wherein the control unit corrects the input signal into a value obtained by multiplying a reciprocal of the received supply voltage with respect to the reference supply voltage by the input signal.

5. A method for compensating for an output signal, comprising:
 converting, by a regulator, power supplied from a power supply unit into a preset voltage;
 receiving, by an input unit, a voltage from the regulator and receiving an external input signal;
 receiving, by a control unit, the voltage from the regulator and transmitting the input signal after preset signal processing; and
 receiving, by an output unit, power from the power supply unit and outputting the received input signal,
 wherein in the receiving of the external input signal, the input unit receives a supply voltage of the power supply unit and transmits the received supply voltage to the control unit, and
 in the transmitting of the input signal, the control unit compensates for the input signal based on a preset reference supply voltage of the power supply unit and the received supply voltage,
 wherein in the transmitting of the input signal, the control unit compensates for the input signal such that the input signal is inversely proportional to the magnitude of the received supply voltage with respect to the reference supply voltage.

6. The method of claim 5, further comprising storing, by the input unit, the supply voltage of the power supply unit in a memory unit.

7. The method of claim 5, wherein in the receiving of the external input signal,
 the input unit comprises an ADC to convert a received analog signal into a digital signal, and the output unit comprises a DAC to convert the digital signal into an analog signal.

8. The method of claim 5, wherein the control unit corrects the input signal into a value obtained by multiplying a reciprocal of the received supply voltage with respect to the reference supply voltage by the input signal.

* * * * *